(12) United States Patent
Tsuda et al.

(10) Patent No.: US 9,189,840 B2
(45) Date of Patent: Nov. 17, 2015

(54) ELECTRONIC DRAWING GENERATION APPARATUS, METHOD FOR GENERATING ELECTRONIC DRAWING, AND PROGRAM PRODUCT

(71) Applicant: DENSO CORPORATION, Kariya, Aichi (JP)

(72) Inventors: Takahiro Tsuda, Kariya (JP); Kouji Ichikawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 292 days.

(21) Appl. No.: 13/934,685

(22) Filed: Jul. 3, 2013

(65) Prior Publication Data

US 2014/0010435 A1   Jan. 9, 2014

(30) Foreign Application Priority Data

Jul. 4, 2012  (JP) ................................. 2012-150681

(51) Int. Cl.
 *G06T 7/00* (2006.01)
 *G06F 17/50* (2006.01)
 *G09B 23/18* (2006.01)

(52) U.S. Cl.
 CPC .......... *G06T 7/0004* (2013.01); *G06F 17/5045* (2013.01); *G06F 17/5081* (2013.01); *G09B 23/18* (2013.01); *G09B 23/181* (2013.01); *G09B 23/182* (2013.01); *G09B 23/183* (2013.01)

(58) Field of Classification Search
 None
 See application file for complete search history.

(56) References Cited

U.S. PATENT DOCUMENTS

| | | | | |
|---|---|---|---|---|
| 5,625,578 A * | 4/1997 | Du Cloux et al. | .................. | 703/2 |
| 6,106,567 A * | 8/2000 | Grobman et al. | ................ | 716/55 |
| 6,691,076 B1* | 2/2004 | Nagase et al. | ..................... | 703/2 |
| 8,412,506 B2* | 4/2013 | Yamagajo | ........................ | 703/13 |
| 2004/0073880 A1* | 4/2004 | Yoshida et al. | .................... | 716/8 |
| 2009/0193369 A1* | 7/2009 | Chan et al. | ......................... | 716/4 |
| 2010/0276809 A1* | 11/2010 | Ding et al. | .................... | 257/773 |

FOREIGN PATENT DOCUMENTS

| | | |
|---|---|---|
| JP | 10-247207 A | 9/1998 |
| JP | 2000-028665 A | 1/2000 |
| JP | 2000-029919 A | 1/2000 |
| JP | 2001-155048 A | 6/2001 |
| JP | 2008-242724 A | 10/2008 |
| JP | 4401135 B2 | 1/2010 |

OTHER PUBLICATIONS

Office Action mailed May 13, 2014 in the corresponding JP application No. 2012-150681 (with English Translation).

* cited by examiner

*Primary Examiner* — Jason Heidemann
(74) *Attorney, Agent, or Firm* — Posz Law Group, PLC

(57) ABSTRACT

An electronic drawing generation apparatus includes: a shape determination section to determine a necessary part, which needs to be subjected to simulation, in a substrate serving as a simulation target; and a shape edit section to cut out the necessary part determined by the shape determination section from an input electronic drawing so as to prepare an output electronic drawing. The shape determination section includes a design rule check section to determine a design-rule violating part as the necessary part based on design rules stored in a design rule database.

9 Claims, 6 Drawing Sheets

FIG. 2

| RULE NAME | ID | KIND | RANGE | BASIS |
|---|---|---|---|---|
| CROSS TALK 1 | xls.1 | EMC | DEPTH: 0 | INTER-WIRE DIS < 1mm PARALLEL > 5mm |
| CROSS TALK 2 | xls.2 | EMC | DEPTH: 1 | INTER-WIRE DIS < 1mm PARALLEL > 5mm |
| ⋮ | ⋮ | ⋮ | ⋮ | ⋮ |
| INTER-PART DIS | part_dist1 | EMC | DEPTH: 0 | INTER-PART DIS < 1mm |
| ⋮ | ⋮ | ⋮ | ⋮ | ⋮ |
| GND UNDER COIL | coil_gnd1 | EMC | DEPTH: 2 | GND UNDER COIL DIAMETER +2mm |
| GND UNDER IC | ic_gnd1 | EMC | DEPTH: 1 | GND UNDER COIL DIAMETER |
| ⋮ | ⋮ | ⋮ | ⋮ | ⋮ |

FIG. 3

| WIRING NAME | FORMATION POSITION |
|---|---|
| E1_0 | ... |
| E1_1 | ... |
| E1_2 | ... |
| E1_3 | ... |
| E1_4 | ... |
| E1_5 | ... |
| F1_0 | ... |
| F1_1 | ... |
| F2_0 | ... |
| F2_1 | ... |
| F2_2 | ... |
| F2_3 | ... |

| RULE NAME | ID | TECHNIQUE | PROCEDURE | RANGE |
|---|---|---|---|---|
| CROSS TALK | xls1<br>xls2<br>xls3<br>xls4<br>... | 2D | REMOVE ... | ENTIRE |
|  |  | 2.5D | LEAVE ... | ENTIRE |
|  |  | 3D | REMOVE ... | <100mm ... |
|  |  | 3D_with_GPU | LEAVE ... | <300mm ... |
| ⋮ | ⋮ | ⋮ | ⋮ | ⋮ |
| GND UNDER COIL | coil_gnd1 | 2.5D | LEAVE ... | ENTIRE |
|  |  | 3D | LEAVE ... | <150mm ... |
|  |  | 3D_with_GPU | LEAVE ... | <300mm ... |
| ⋮ | ⋮ | ⋮ | ⋮ | ⋮ |

| DESIGN RULE VIOLATING PARTS |||
|---|---|---|
| NAME | ID | FORMATION POSITION |
| F1_0 | xls1 | ... |
| F1_1 | xls1 | ... |
| F2_0 | xls1 | ... |
| ⋮ | ⋮ | |

| DESIGN RULE VIOLATING PARTS ||||
|---|---|---|---|
| GROUP | NAME | ID | FORMATION POSITION |
| F | F1_0 | xls1 | ... |
| | F1_1 | xls1 | ... |
| | F2_0 | xls1 | ... |
| | ⋮ | ⋮ | |

| RULE NAME | ID | KIND | RANGE | BASIS |
|---|---|---|---|---|
| CROSS TALK 1 | xls.1 | EMC | DEPTH: 0 | OUTPUT NG ALWAYS |
| CROSS TALK 2 | xls.2 | EMC | DEPTH: 1 | INTER-WIRE DIS < 1mm PARALLEL > 5mm |
| ⋮ | ⋮ | ⋮ | ⋮ | ⋮ |
| INTER-PART DIS | part_dist1 | EMC | DEPTH: 0 | INTER-PART DIS < 1mm |
| ⋮ | ⋮ | ⋮ | ⋮ | ⋮ |
| GND UNDER COIL | coil_gnd1 | EMC | DEPTH: 2 | OUTPUT NG ALWAYS |
| GND UNDER IC | ic_gnd1 | EMC | DEPTH: 1 | GND UNDER COIL DIAMETER |
| ⋮ | ⋮ | ⋮ | ⋮ | ⋮ |

ELECTRONIC DRAWING GENERATION APPARATUS, METHOD FOR GENERATING ELECTRONIC DRAWING, AND PROGRAM PRODUCT

CROSS REFERENCE TO RELATED APPLICATION

The present application is based on Japanese Patent Application No. 2012-150681 filed on Jul. 4, 2012, the disclosure of which is incorporated herein by reference.

TECHNICAL FIELD

The present disclosure relates to an electronic drawing generation apparatus for an electromagnetic field simulator, a method for generating an electronic drawing, and a program product.

BACKGROUND ART

[Patent Literature 1] JP 2008-242724 A

In designing electronic components, electromagnetic field simulation is used in order to solve electromagnetic defects such as electromagnetism compatibility (EMC). Large-sized circuits require a long time for performing accurate simulation; therefore, the means of performing the simulation in a shorter time has been studied.

For example, Patent Literature 1 proposes a simulation apparatus (electromagnetic field simulator), program, and method for analyzing efficiently a point at which cross talk arises. The above simulation apparatus has an electromagnetic field analysis means, an electric field trace means, and a connection point output means. The electromagnetic field analysis means executes electromagnetic field analysis about analytic space. The electric field trace means traces an electric field vector based on the result of the electromagnetic field analysis. The connection point output means outputs two signal lines which may cause the cross talk. The above apparatus permits analysis on the point, where the cross talk arises, without making the whole circuit into the analysis target, shortening analysis time.

However, the invention in Patent Literature 1 still needs to determine the point which is subjected to detailed simulation of the cross talk while executing electromagnetic field simulation for electric field trace; this fails to shorten the simulation time. In addition, the invention in Patent Literature 1 is applied only to the cross talk, not providing satisfactory general versatility.

In addition, the simulation by cutting out only a point which needs analysis is generally performed by some operators of the electromagnetic field simulator; however, the examination of the cut point needs a design know-how and time of such operators. Therefore, the time necessary for the simulation and the result depend on the capability of each operator.

SUMMARY

It is an object of the present disclosure to permit electromagnetic field simulation to be executed in a shorter time while providing general versatility.

To achieve the above object, according to an aspect of the present disclosure, an electronic drawing generation apparatus is provided for generating an electronic drawing given to an electromagnetic field simulator for analyzing an electric field and a magnetic field of a substrate where a circuit is formed based on the electronic drawing. The apparatus includes a shape determination section, a shape edit section, and a storage storing a design rule database. The shape determination section determines a necessary part in the substrate, the necessary part needing to be subjected to simulation by the electromagnetic field simulator. The shape edit section cuts out the necessary part determined by the shape determination section. The design rule database includes design rules. Further, the shape determination section includes a design rule check section that determines a design-rule violating part as the necessary part, the design-rule violating part being a part violating the design rules.

Under the configuration of the above aspect, the design rule check section in the shape determination section determines as a necessary part a design-rule violating part, which violates a design rule, within a substrate including the circuit. The shape edit section cuts put the necessary part from the substrate automatically. This enables the size of the electronic drawing inputted into the electromagnetic field simulator to decrease to only the necessary part which is cut out from the whole of the substrate. It is noted that the design rule is not limited to only the condition to prevent cross talk; the necessary part includes a part, which violates another design rule other than that related with the cross talk. Therefore, providing the electronic drawing, which describes the necessary part cut out by the shape edit section, into the electromagnetic field simulator can shorten the simulation time while providing general versatility.

As another aspect of the present disclosure, a method is provided for generating using a computer an electronic drawing given to an electromagnetic field simulator for analyzing an electric field and a magnetic field of a substrate where a circuit is formed based on the electronic drawing. The method includes: (i) performing a check to an input electronic drawing, which is inputted, based on design rules stored in a storage of a design-rule database, the check being performed to determine a design-rule violating part as a necessary part which needs to be subjected to a simulation; and (ii) performing an edit that cuts out the necessary part after performing the check.

As yet another aspect of the present disclosure, a program product is provided to be stored in a non-transitory computer readable storage medium comprising instructions for execution by a computer. The instructions include the above method for generating an electronic drawing. The method is computer-implemented.

BRIEF DESCRIPTION OF THE DRAWINGS

The above and other objects, features, and advantages of the present disclosure will become more apparent from the following detailed description made with reference to the accompanying drawings. In the drawings:

FIG. 2 is a diagram illustrating examples of design rules;

FIG. 3 is a diagram illustrating examples of connection information;

DETAILED DESCRIPTION

The following describes embodiments of the present disclosure with reference to drawings. In the embodiments mentioned below, mutually identical or equivalent members are assigned with the same reference numbers.

First Embodiment

With reference to FIGS. 1 to 5, a schematic configuration of an electronic drawing generation apparatus 10 according to the present embodiment will be explained.

The electronic drawing generation apparatus 10 of the present embodiment is to generate an electronic drawing, which is equivalent to drawing data of CAD (Computer Aided Design), inputted or provided into an electromagnetic field simulator (unshown). To be specific, the electronic drawing generation apparatus 10 cuts out necessary parts necessary for performing electromagnetic field simulation, (i.e., to delete unnecessary parts) from an electronic drawing (i.e., an input electronic drawing 100) inputted into the apparatus 10, thereby generating or outputting an electronic drawing (i.e., an output electronic drawing 110) which is to be provided or inputted to the electromagnetic field simulator.

Figure 1:
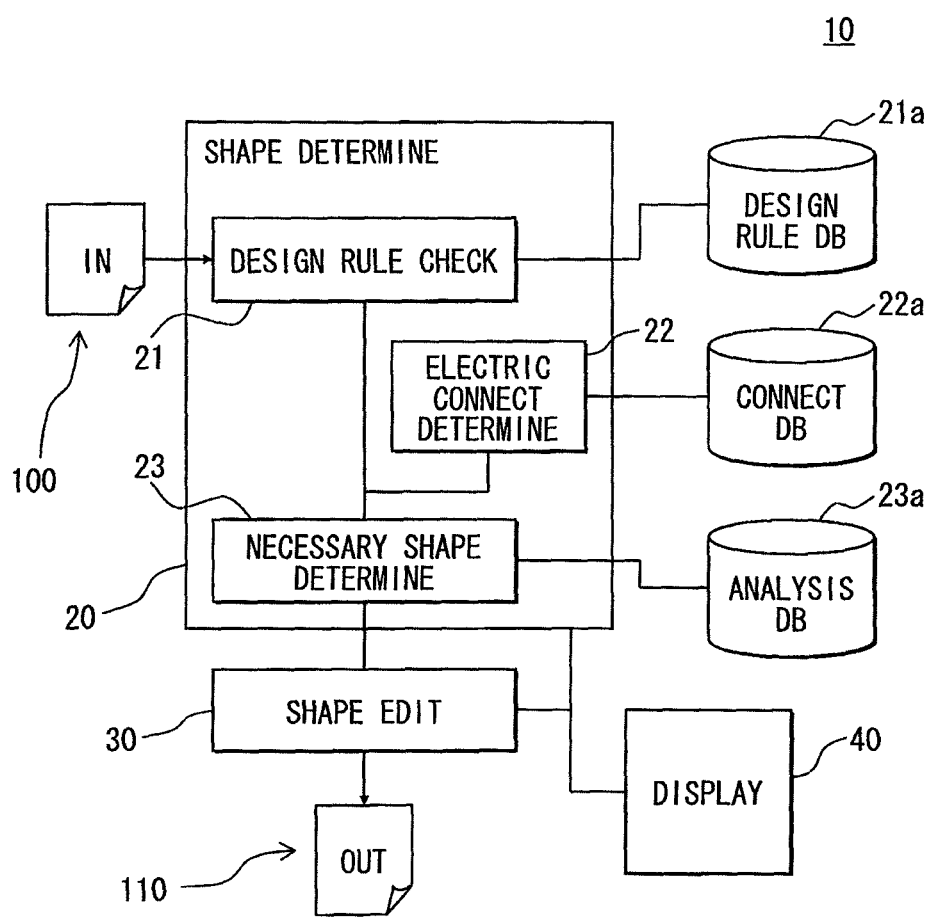
FIG. 1 is a block diagram illustrating a schematic configuration of an electronic drawing generation apparatus according to a first embodiment of the present disclosure.

The electronic drawing generation apparatus 10 includes a shape determination section 20 and a shape edit section 30, as indicated in FIG. 1. The shape determination section 20 determines a necessary part(s) in an input electronic drawing 100, which is inputted to the electronic drawing generation apparatus 10. The shape determination section 20 then outputs information on the necessary part(s) to the shape edit section 30. The shape edit section 30 cuts out only the necessary part(s) from the input electronic drawing 100, and outputs it as an output electronic drawing 110. In addition, the electronic drawing generation apparatus 10 in the present embodiment includes a display portion 40.

The shape determination section 20 in the present embodiment includes a design rule check section 21, an electrical connection determination section 22, and a necessary shape determination section 23. These sections 21 to 23 may be referred to as sub-sections included in the shape determination section 20.

The design rule check section 21 is connected with and communicates with a design rule database 21a that stores design rules. The design rules are arrangement conditions of circuits to cause electric or magnetic defects as indicated in FIG. 2. Each rule name is provided with columns of rule ID, kind, determination range, and determination basis. For instance, the rule name "CROSS TALK 1" indicates (i) a determination range defining a layer depth and (ii) a determination basis for outputting NG (no good); the determination basis describes inter-wiring distance and parallel wiring length, which result in defects. The design rule check section 21 determines a design-rule violating part(s) in the input electronic drawing 100 based on the design rules; the design-rule violating part is a part that meets the condition described in the determination range and determination basis. The design rule check section 21 determines the design-rule violating part as a necessary part, and outputs the data indicating the design-rule violating part in the input electronic drawing 100 to the necessary shape determination section 23. The data indicating the design-rule violating part contains (i) a name and coordinate, which indicate a formation position of the design-rule violating part, and (ii) a rule name and rule ID, which the violated rule corresponds to.

Figures 4, 5:
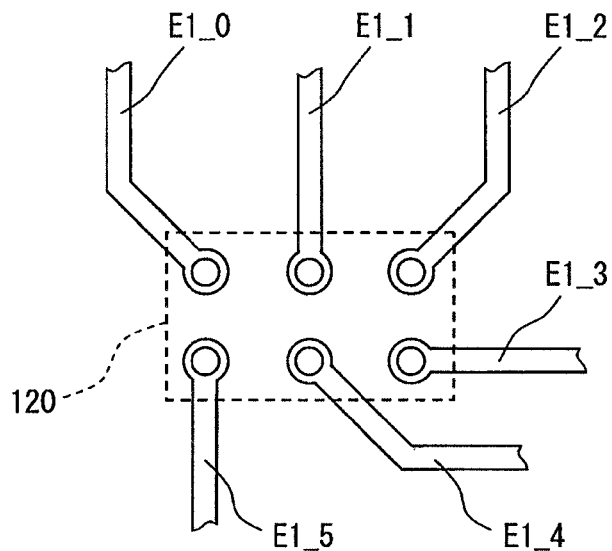
FIG. 4 is a schematic diagram illustrating examples of wiring.
FIG. 5 is a diagram illustrating examples of analysis techniques.

The electrical connection determination section 22 is connected with and communicates with a connection database 22a that includes connection information. The connection information is a list containing names given to wirings, which constitute a circuit formed in a substrate, for convenience, as indicated in FIG. 3. For example, as indicated in FIG. 4, wirings E1_0 to E1_5 are electrically separated or insulated from each other on the electronic drawing; however, they are electrically connected in the practical circuit by an element 120 such as an IC chip. Wirings like E1_0-E1_5 each are managed by the wiring names that are assigned with common character string. In the example indicated in FIG. 3 and FIG. 4, "E1" corresponds to the common character string. That is, the wirings containing the common character string "E1" are to be electrically connected at the time of operating or actuating the circuit. The electrical connection determination section 22 determines, as an additional part, the wiring the name of which contains the character string common to that of a design-rule violating part, based on the connection information stored in the connection database 22a. The electrical connection determination section 22 determines the additional portion as part of the necessary part, and outputs the data, which indicates the additional part in the data of the input electronic drawing 100, to the necessary shape determination section 23.

The necessary shape determination section 23 is connected with and communicates with an analysis technique database 23a that contains a list of analysis techniques or means depending on or complying with the electromagnetic field simulator. The list of the analysis techniques in FIG. 5 describes analysis techniques available in the electromagnetic field simulator for simulation, and also describes cutting procedures or methods to cut out parts necessary for analysis when using the analysis techniques, and ranges to which the cutting procedures are applied. Suppose that the rule name "CROSS TALK 1" in FIG. 2 corresponds to a design-rule violating part determined by the design rule check section 21. As indicated in FIG. 2, the rule ID of "CROSS TALK 1" is "xls1"; here, the rule ID is an ID or identification unique to each rule name or design-rule item. With reference to FIG. 5, the row of the rule name "CROSS TALK" containing the rule ID of "xls1" describes four kinds of analysis techniques or means of "2D", "2.5D", "3D", and "3D_with_GPU" as solution means. That is, in the present embodiment, users can consider accuracy and time of electromagnetic field simulation, and select one or more than one from among the four kinds of analysis techniques. The analysis techniques each indicate a cutting procedure or method necessary for executing each analysis technique and a range to cut out. The necessary shape determination section 23 determines a necessary part that is necessary for the electromagnetic field simulation from among the design-rule violating part(s) and additional part(s) based on the cutting procedure corresponding to the analysis technique which the user selects. The necessary shape determination section 23 outputs the data, which indicates the above determined necessary part in the data of the input electronic drawing 100, to the shape edit section 30.

Returning to FIG. 5, explanation is added as follows. First, "CROSS TALK" may be subjected to four techniques 2D, 2.5D, 3D, and 3D_with_GPU. Here, "D" signifies dimensional technique. "2D" signifies two-dimensional technique; "3D" signifies three-dimensional technique. "2.5D" signifies a combination of two-dimensional technique and three-dimensional technique. "GPU" signifies Graphic Processing Unit. Now, "2D" describes a cutting procedure "remove all wirings except GND wiring and inputted wiring" with respect to the range "entire". "2.5D" describes a cutting procedure "leave area: (i) inputted wiring, (ii) power source/ground wiring, and (iii) signal wiring within 5 mm from inputted wiring in depth 0 (same layer) and within 0.1 mm from inputted wiring in xy directions in depth 1" with respect to the range "entire". "3D" describes a cutting procedure "remove area other than within 30 mm from inputted wiring in xy directions, whereas when ground just under inputted wiring is divided, enlarging the area up to undivided" with respect to the range "within 100 mm from inputted wiring (remove unconditionally outside of 100 mm)". "3D_with_GPU" describes a cutting procedure "leave area: (i) inputted wiring, (ii) power source/ground wiring, and (iii) signal wiring within 5 mm from inputted wiring in depth 0 (same layer) and within 0.1 mm from inputted wiring in depth 1" with respect to the range "within 300 mm from the inputted wiring (remove unconditionally outside of 300 mm)". Next, "GND UNDER COIL" may be subjected to three techniques 2.5D, 3D, and 3D_with_GPU. "2.5D" describes a cutting procedure "leave (i) all wirings connected with coil part, and (ii) power/ground wiring within 10 mm in depth 0 (same layer) and within 10 mm in xy directions in depth 2, and remove other" with respect to the range "entire". "3D" describes a cutting procedure "leave area within coil outer diameter plus 32 mm and within 30 mm from wiring connected to coil, and remove other, whereas enlarging the left area when ground just under coil is divided in midway" with respect to the range "within 150 mm from the coil outer diameter". "3D_with_GPU" describes a cutting procedure "leave (i) all wirings connected with coil part, and (ii) power/ground wiring within 10 mm in depth 0 (same layer) and within 100 mm in xy directions in depth 2, and remove other" with respect to the range "within 300 mm from inputted wiring (remove outside of 300 mm unconditionally)".

The shape edit section 30 cuts out only the necessary part(s) from the input electronic drawing 100, and outputs the cut necessary part(s) as an output electronic drawing 110. The user inputs the output electronic drawing 110 into the electromagnetic field simulator, and executes a electromagnetic field simulation.

The display portion 40 is connected with and communicates with the shape determination section 20 and the shape edit section 30. This display portion 40 including a display unit displays or outputs visually (i) the necessary part(s) which the design rule check section 21 and the necessary shape determination section 23 determine, and (ii) the additional part(s) which the electrical connection determination section 22 determines. The display portion 40 may be also referred to as a visualization portion or section.

The electronic drawing generation apparatus 10 mainly includes a known microcomputer containing a CPU, memories or storages (such as ROM, RAM, EEPROM), I/O, and a bus connecting the foregoing components. For example, the design rule database 21a, the connection database 22a, and the analysis technique database 23a are stored in the memories. In other words, the memories may function as database storages. Further, the electronic drawing generation apparatus 10 may achieve the processes or functions of the shape determination section 20 and the shape edit section 30 by executing programs stored in the memories; the section may be referred to as means or device.

Subsequently, with reference to FIG. 6, the preparation process of the output electronic drawing 110 will be explained.

At S1, a user prepares an electronic drawing of a substrate where a circuit serving as a target of electromagnetic field simulation is formed. This electronic drawing is equivalent to an input electronic drawing 100 illustrated in FIG. 1. The user inputs the input electronic drawing 100 into the electronic drawing generation apparatus 10.

Next, the design rule check section 21 executes S2. The design rule check section 21 searches for a design-rule violating part in the input electronic drawing 100 based on the design rules (FIG. 2) stored in the design rule database 21a. S2 may be referred to as a check step.

At S3, the design rule check section 21 determines whether a design-rule violating part is included in the input electronic drawing 100. When any design-rule violating part is not found out (S3: NO), the present process ends. In this case, the electronic drawing generation apparatus 10 does not output any output electronic drawing 110, or outputs the same drawing as the input electronic drawing 100 as an output electronic drawing 110.

When a design-rule violating part(s) is found out (S6: YES), the design rule check section 21 and the display portion 40 execute S4. The design rule check section 21 outputs the data indicating the design-rule violating part(s) to the display portion 40. The display portion 40 displayed so that the user can see the shapes of the design-rule violating part(s). S4 may be referred to as a visualization step.

Next, the user performs S5. The user selects an analytical target, which needs analysis, from among the design-rule violating part(s) displayed on the display portion 40. Here, the user can select one or more than one design-rule violating part.

Next, the user performs S6. The user selects whether to add an additional part to the design-rule violating part(s) selected at S5. When not adding any additional part (S6: NO), the process proceeds to S8, without adding any additional part to the design-rule violating part(s).

In contrast, when adding an additional part (S6: YES), the electrical connection determination section 22 executes S7, the electrical connection determination section 22 extracts an additional part(s) corresponding to the design-rule violating part(s) selected at S5 based on the connection information (FIG. 3) in the connection database 22a. The electrical connection determination section 22 determines the extracted additional part(s) as a necessary part(s) along with the design-rule violating part(s). S7 may be referred to as an additional part determination step.

Next, the necessary shape determination section 23 executes S8. The necessary shape determination section 23 extracts one or more than one analysis technique corresponding to the electromagnetic field simulator based on the analysis techniques (FIG. 5) in the analysis technique database 23a. Necessary parts corresponding to the design-rule violating part(s) and additional part(s) are determined with respect to each analysis technique. S8 may be referred to as a necessary shape determination step.

At S9, the display portion 40 displays the shape of the necessary part(s) determined at S8 together with the analysis technique(s). S9 may be referred to as a visualization step.

Next, the user performs S10. The user selects one or more than one analysis technique from among the analysis technique(s) presented at S9. Then, the necessary shape determination section 23 outputs the data, which indicates the necessary part(s) corresponding to the selected analysis technique(s), to the shape edit section 30.

Next, the shape edit section 30 executes S11. The shape edit section 30 cuts out the necessary part of the input electronic drawing 100 based on the data indicating the necessary part(s) outputted from the necessary shape determination section 23. That is, the unnecessary part which is not used for the electromagnetic field simulation is removed. The drawing after cutting is outputted as the output electronic drawing 110. It is noted that when the user selects more than one analysis technique at S10, more than one output electronic drawing 110 is outputted depending on more than one analysis technique, respectively. S11 may be referred to as an edit step.

Next, the display portion 40 executes S12. The display portion 40 displays the output electronic drawing 110 outputted at S11. S12 may be referred to as a visualization step.

Next, the user performs S13. The user confirms visually the output electronic drawing(s) 110 displayed on the display portion 40 at S11.

The following will explain an advantageous effect of the electronic drawing generation apparatus 10 according to the present embodiment.

In the present embodiment, the design-rule violating part(s) determined at S2 (check step) is displayed on the display portion 40 at S4. The user can then select the necessary part(s) which needs the electromagnetic field simulation from among the design-rule violating part(s) as candidate. That is, the user does not need to determine a necessary part by himself/herself, but the user can determine an analytical target by only mechanically selecting a necessary part from the presented candidate. This can eliminate influence due to the difference in the users' capabilities, as compared with the case where the necessary part is determined by a user based on the result of the check of the design rules by the user. In addition, the human failure at the time of determination of the necessary part can also be reduced.

In addition, in the present embodiment, the electronic drawing generation apparatus 10 includes the necessary shape determination section 23. The necessary shape determination section 23 determines only part needed for analysis with respect to the design-rule violating part and additional part. This configuration permits the selection of the analysis techniques according to the electromagnetic field simulator. Therefore, the necessary shape determination section 23 can output the data indicating the suitable necessary parts according to the analysis techniques to the shape edit section 30. The shape edit section 30 removes automatically the parts which do not need to be subjected to the simulation from among the design-rule violating parts and additional parts based on the selected analysis techniques. This can shorten the time as compared with the case of determining the necessary part, which is cut out from the whole substrate, only by the design rule check section 21. Further, how to cut the necessary parts corresponding to the analysis techniques is previously stored in the analysis technique database 23a. Thus, even when selecting the analysis techniques at S10 in FIG. 6, the user does not need to determine the parts that are cut out. This can eliminate influence due to the difference between the users' capabilities when determining the shape of the necessary part according to the analysis technique, as compared with the case where the user determines. In addition, the human failure at the time of determination of the necessary part can also be reduced. In addition, it is not necessary to examine the cut parts; this reduces the time for examination.

In addition, in the present embodiment, the electronic drawing generation apparatus 10 includes the electrical connection determination section 22. This permits the cutting out of necessary parts including additional parts that are to be electrically connected essentially. The above configuration can generate an electronic drawing for performing a higher-precision simulation, as compared with the case of not providing the connection database 22a and the electrical connection determination section 22.

Figure 6:
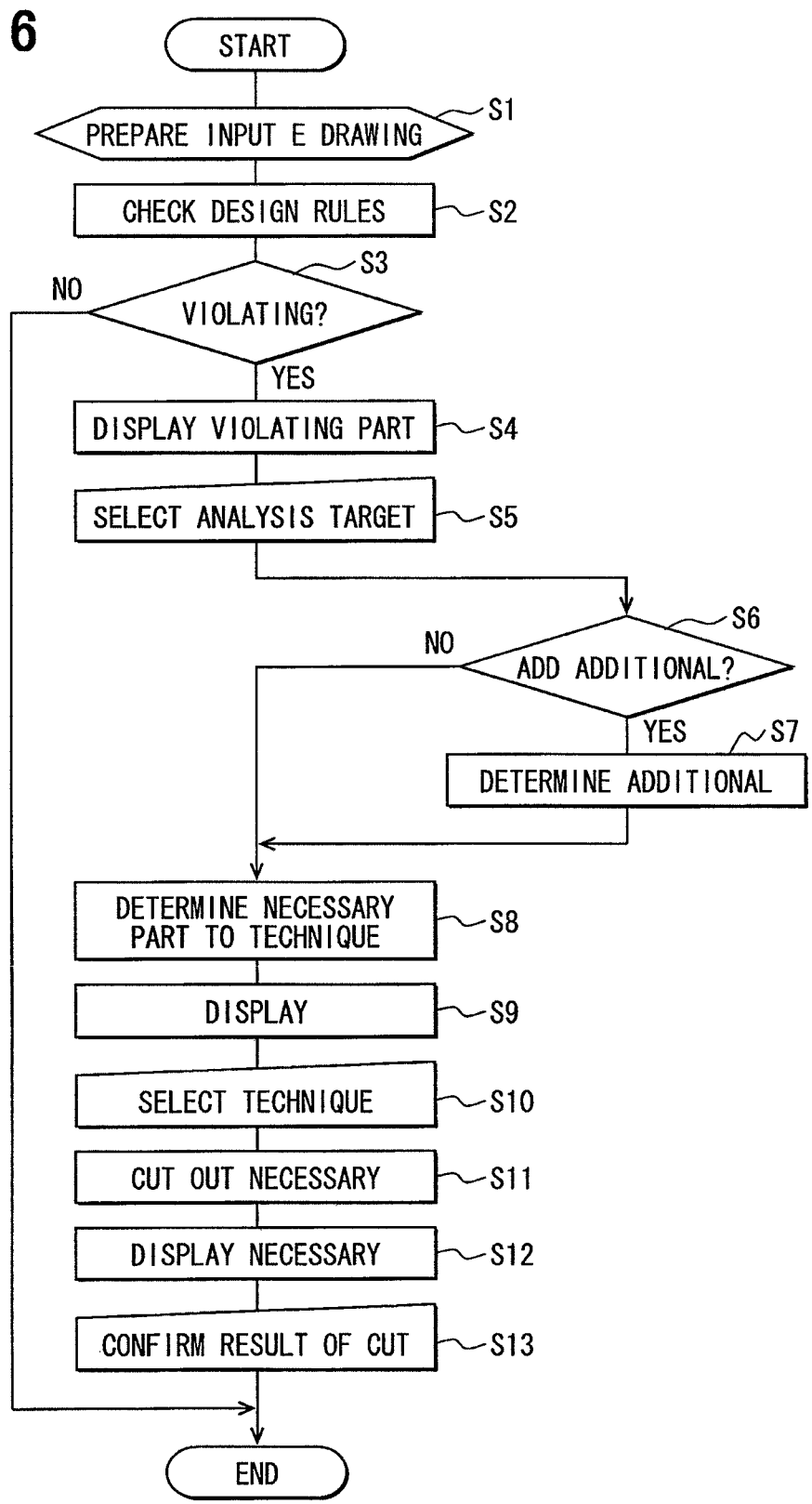
FIG. 6 is a flowchart diagram illustrating a preparation process of an output electronic drawing.

Automatic data exchange can be made in the flowchart in FIG. 6 except for the preparation of the input electronic drawing 100 at S1, the selection of the analytical target at S5, the selection of whether to add the additional parts at S6, the selection of the analysis techniques at S10, and the confirmation of the cutting result at S13. This can shorten the work time as compared with the case where examination and cutting work of the necessary part are made manually.

In addition, the output electronic drawing 110 for inputting into the electromagnetic field simulator is made small-sized as compared with the input electronic drawing 100; this shortens the working time such as mesh dividing in the simulator. In addition, the processing time of the simulation itself can also be reduced.

In addition, the design-rule violating parts, if present, is cut out as a necessary part as indicated in the flowchart. Therefore, as compared with the case where the analytical target is only the cross talk, the analytical target can be extended.

The step of manual change or fine adjustment by users may be provided in between the selection of the analysis techniques at S10 and the cutting of the necessary parts at S11. This permits the user to determine flexibly necessary parts in addition to the selective shape determination at the check step (S2), additional part determination step (S7), and necessary shape determination step (S8).

Second Embodiment

In the first embodiment, the design rule check section 21 outputs the data indicating the design-rule violating parts to the display portion 40 at S2. Then, at S4, the display portion 40 displays the respective design-rule violating parts separately. In contrast, at S2 (check step), the second embodiment provides an example to group several design-rule violating parts that are neighboring to each another. Then, at S4, the several neighboring design-rule violating parts are displayed by the display portion 40 as a group.

Figures 7, 8, 9:
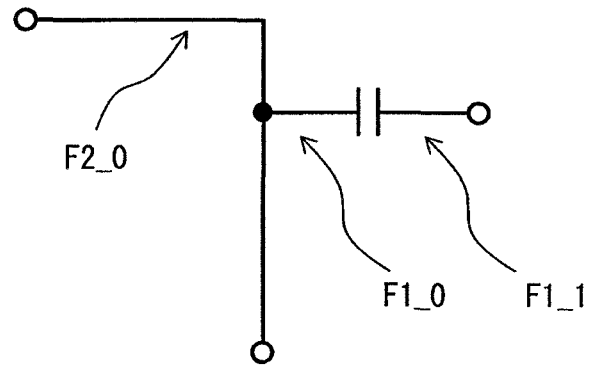
FIG. 7 is a diagram illustrating an example of a design-rule violating part according to a second embodiment of the present disclosure.
FIG. 8 is a diagram illustrating an example of displaying design-rule violating parts.
FIG. 9 is a diagram illustrating another example of displaying design-rule violating parts.

To be specific, the design rule check section 21 is connected with the connection database 22a as well as being connected with the design rule database 21a. Under such configuration, several design-rule violating parts can be grouped based on the connection information stored in the connection database 22a. Refer to FIG. 7 that illustrates a circuit containing wirings F2_0, F1_0, and F1_1. Suppose that all the wirings each correspond to the design-rule violating part. The design-rule violating parts, if not being grouped, are displayed by the display portion 40 at S4 as illustrated in FIG. 8. That is, the display portion 40 displays the respective design-rule violating parts separately. In contrast, the design-rule violating parts, when being grouped, are displayed by the display portion 40 at S4 as illustrated in FIG. 9. The design rule check section 21 determines the design-rule violating parts of the wirings F2_0, F1_0, and F1_1 as one group "P", and causes the display portion 40 to display them as the group.

Further, the design-rule violating parts, when exist within a predetermined distance mutually, may be grouped.

Therefore, at S5, the user can select collectively the parts that should be subjected to the electromagnetic field simulation (i.e., all the neighboring design-rule violating parts) from many design-rule violating parts, without omission. That is, selecting a design-rule violating part group, which is obtained by grouping several design-rule violating parts, permits one-time selection of the several design-rule violating parts. Therefore, the user can select the design-rule violating parts promptly without omission.

Third Embodiment

The above-mentioned embodiments provide examples where the design rule check section 21 determines the design-rule violating parts as necessary parts at S2 (check step) based on predetermined design rules (the determination range and determination basis indicated in FIG. 2). Further, there are cases that the electromagnetic field simulation is desirably applied to parts that do not violate the design rules, i.e., that do not meet the determination range or determination basis described in the design rules.

The present embodiment provides an example where some or all the rule names or items in the design rules stored in the design rule database 21*a* do not give any determination basis so as to be determined as design-rule violating parts. That is, data processing is carried out previously to permit at least one design rule to be determined as a design-rule violating part certainly. To be specific, with reference to FIG. 10, the rule name "CROSS TALK 1" and the rule name "GND UNDER COIL", both of which are pointed by arrow "A" in design rules, each present the determination basis as "OUTPUT NG ALWAYS". Thereby, the circuit relative to the rule name "CROSS TALK 1" and "GND UNDER COIL" can be always determined as a necessary part at the check step (S2), regardless of the arrangement conditions of wirings or coils. It is noted that the design rules in the present embodiment is obtained by changing the determination basis of the design rules (FIG. 2) in the first embodiment and the second embodiment. There is no need to be limited to this example. The previously prepared design rules may not include a part that is desirably subjected to the electromagnetic field simulation. In such cases, users may newly add a rule the determination basis of which is "OUTPUT NG ALWAYS"; this permits a part of the substrate corresponding to the added rule to be determined as a necessary part.

Other Embodiments

Figures 10, 11:
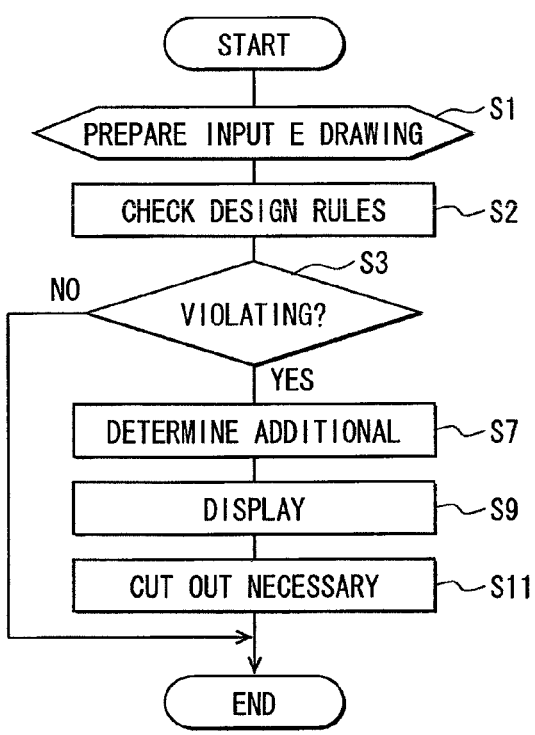
FIG. 10 is a diagram illustrating examples of design rules in an electronic drawing generation apparatus according to a third embodiment of the present disclosure.
FIG. 11 is a flowchart diagram illustrating another preparation process of an output electronic drawing according to another embodiment of the present disclosure.

The embodiments of the present disclosure are thus described; however, without being restricted to the embodiments mentioned above, the present disclosure may be variously modified as long as not deviating from the scope thereof. The above embodiments present examples of the preparation process of the output electronic drawing 110 where the user performs the selection manipulation and confirmation manipulation at S5, S6, S10, and S13. However, all the sections or steps from when the input electronic drawing 100 is input into the electronic drawing generation apparatus 10 to when the output electronic drawing 110 may be automatically executed. For example, when all the design-rule violating parts are designated previously as analytical targets, S5 can be omitted. Further, when all the additional parts are designated previously as necessary parts, S6 can be omitted. Further, when predetermined analysis techniques are predetermined, S10 can be omitted. In addition, the user does not necessarily confirm the result; S13 can be omitted. Thus, a configuration may be designed such that the respective manipulations or selections by the user provide predetermined results certainly. This permits automatic execution of all the sections or steps from when the input electronic drawing 100 is input into the electronic drawing generation apparatus 10 to when the output electronic drawing 110, as illustrated in FIG. 11.

In addition, the above-mentioned embodiments present examples of the electronic drawing generation apparatus 10 that includes the electrical connection determination section 22 and the connection database 22*a*. The electrical connection determination section 22 and the connection database 22*a* are not always necessary. It is noted that the configuration, including the electrical connection determination section 22 and the connection database 22*a*, can cut out necessary parts including additional parts that are to be electrically connected essentially; thus, the electronic drawing can be prepared for allowing the high-precision simulation.

In addition, the above-mentioned embodiments present examples of the electronic drawing generation apparatus 10 that includes the necessary shape determination section 23 and the analysis technique database 23*a*. The necessary shape determination section 23 and the analysis technique database 23*a* are not always necessary. For example, when the electromagnetic field simulator may comply with only the analysis technique of 2D, there is no option for the user to select one of analysis techniques at S10 in FIG. 6 so that the cutting procedure complying with the one analysis technique is merely adopted. Therefore, a configuration may be preferred such that the cutting technique is uniquely determined when the analytical target is determined at S5, or when the analytical target and additional parts are determined at S7.

That is, the electronic drawing generation apparatus 10 may include either or neither the electrical connection determination section 22 or the necessary shape determination section 23.

Furthermore, the above embodiments present examples of the electronic drawing generation apparatus 10 that includes the display portion 40; however, the display portion 40 is not always necessary. In the above embodiments, the user makes determination to select an analytical target at S5, select an analysis technique at S10, and confirm the result of cutting at S13. However, when such determinations are fixed as resulting in predetermined choice, candidates of the choice need not to be presented to the user. Such configuration needs not to have a display portion always.

In addition, the above embodiments present the examples of the electronic drawing generation apparatus 10 that includes the shape edit section 30; alternatively, the user may be required to cut necessary parts. However, as described above, providing the shape edit section 30 for automatic cutting shortens working time for generating an output electronic drawing 110 significantly.

While aspects of the disclosure described herein are already recited in the preceding summary, further optional aspects thereto may be set out as follows.

For instance, as an optional aspect of the disclosure, a storage may be included to store an analysis technique database that includes a list of analysis techniques complying with the electromagnetic field simulator. The shape determination section may include a necessary shape determination section that determines the necessary part based on the design-rule violating part and the analysis techniques in the analysis technique database.

This configuration permits the selection of the analysis technique depending on or complying with the electromagnetic field simulator. The shape edit section can delete the part, which is unnecessary for the simulation, from the design-rule violating parts based on the selected analysis technique. This can shorten the time as compared with the case of determining the necessary part, which is cut out from the whole substrate, only by the design rule check section.

Further, as another optional aspect of the disclosure, a storage may be included to store a connection database that includes connection information containing information on wiring that is electrically connected. The shape determination section may include an electrical connection determination section that determines, as the necessary part, an additional part in addition to the design-rule violating part based on the design-rule violating part and the connection information in the connection database, the additional part being electrically connected to the design-rule violating part.

The wiring included in the circuit contains a wiring, which is electrically connected via an element such as a resistor, even though not electrically connected on the electronic drawing. Therefore, providing the connection database and the electrical connection determination section permits the cutting out of necessary parts including additional parts that are to be electrically connected essentially. The above configuration can generate an electronic drawing for performing a higher-precision simulation, as compared with the case of not providing the connection database and the electrical connection determination section.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic drawing generation apparatus that generates an electronic drawing given to an electromagnetic field simulator for analyzing an electric field and a magnetic field of a substrate where a circuit is formed based on the electronic drawing,
   the apparatus comprising:
   a shape determination device that determines a necessary part in the substrate, the necessary part needing to be subjected to simulation by the electromagnetic field simulator;
   a shape edit device that cuts out the necessary part determined by the shape determination device;
   a storage storing a design rule database that includes design rules; and
   a storage storing an analysis technique database that includes a list of analysis techniques complying with the electromagnetic field simulator,
   wherein the shape determination device includes
      a design rule check section that determines a design-rule violating part as the necessary part, the design-rule violating part being a part violating the design rules included in the design rule database, and
      a necessary shape determination section that determines the necessary part based on the design-rule violating part and the analysis techniques included in the analysis technique database.

2. The electronic drawing generation apparatus according to claim 1, further comprising:
   a storage storing a connection database that includes connection information containing information on wiring that is electrically connected,
   wherein the shape determination device includes an electrical connection determination section that determines, as the necessary part, an additional part in addition to the design-rule violating part based on the design-rule violating part and the connection information in the connection database, the additional part being electrically connected to the design-rule violating part.

3. The electronic drawing generation apparatus according to claim 1, further comprising:
   a visualization portion that outputs the necessary part towards an outside visually for a user to confirm.

4. A method for generating an electronic drawing using a computer, the electronic drawing being given to an electromagnetic field simulator for analyzing an electric field and a magnetic field of a substrate where a circuit is formed based on the electronic drawing,
   the method comprising:
   a check step of performing by a design rule check section included by a shape determination device, a check to an input electronic drawing, which is inputted, based on design rules stored in a storage of a design-rule database, the check being performed to determine a design-rule violating part as a necessary part which needs to be subjected to a simulation;
   a necessary shape determination step of performing, by a necessary shape determination section included by the shape determination device, a necessary-part determination after the check step, the necessary-part determination being performed to determine the necessary part based on the design-rule violating part and an analysis technique stored in a storage of an analysis technique database; and
   an edit step of performing, by a shape edit device, an edit that cuts out the necessary part after the necessary shape determination step.

5. The method according to claim 4, further comprising:
   an additional part determination step of performing, by an electrical connection determination section included by the shape determination device, an additional-part determination based on the design-rule violating part and connection information stored in a storage of a connection database after the check step and before the edit step, the additional-part determination being performed to determine, as the necessary part, an additional part together with the design-rule violating part, the additional part being connected electrically to the design-rule violating part.

6. The method according to claim 4, further comprising:
   a visualization step of performing, by a visualization portion, a visualization to permit a user to confirm the necessary part, the visualization being performed to output the necessary part towards an outside visually.

7. A program product stored in a non-transitory computer readable storage medium comprising instructions for execution by a computer, the instructions being for generating an electronic drawing given to an electromagnetic field simulator for analyzing an electric field and a magnetic field of a substrate where a circuit is formed based on the electronic drawing,
   the instructions comprising:
   a check step of performing by a design rule check section included by a shape determination device, a check to an input electronic drawing, which is inputted, based on design rules stored in a storage of a design-rule database, the check being performed to determine a design-rule violating part as a necessary part which needs to be subjected to a simulation;

a necessary shape determination step of performing, by a necessary shape determination section included by the shape determination device, a necessary-part determination after the check step, the necessary-part determination being performed to determine the necessary part based on the design-rule violating part and an analysis technique stored in a storage of an analysis technique database; and an edit step of performing, by a shape edit device, an edit that cuts out the necessary part after the necessary shape determination step.

8. The program product according to claim 7, the instructions further comprising:

an additional part determination step of performing, by an electrical connection determination section included by the shape determination device, an additional-part determination based on the design-rule violating part and connection information stored in a storage of a connection database after the check step and before the edit step, the additional-part determination being performed to determine, as the necessary part, an additional part together with the design-rule violating part, the additional part being connected electrically to the design-rule violating part.

9. The program product according to claim 7, the instructions further comprising:

a visualization step of performing, by a visualization portion, a visualization to permit a user to confirm the necessary part, the visualization being performed to output the necessary part towards an outside visually.

* * * * *